US012785666B2

(12) United States Patent
Hayashimoto et al.

(10) Patent No.: US 12,785,666 B2
(45) Date of Patent: Nov. 3, 2026

(54) OSCILLATOR

(71) Applicant: Renesas Electronics Corporation, Tokyo (JP)

(72) Inventors: Hajime Hayashimoto, Tokyo (JP); Haowei Cheng, Tokyo (JP)

(73) Assignee: Renesas Electronics Corporation, Tokyo (JP)

( * ) Notice: Subject to any disclaimer, the term of this patent is extended or adjusted under 35 U.S.C. 154(b) by 0 days.

(21) Appl. No.: 19/298,728

(22) Filed: Aug. 13, 2025

(65) Prior Publication Data

US 2026/0051877 A1 Feb. 19, 2026

(30) Foreign Application Priority Data

Aug. 14, 2024 (JP) ................................ 2024-135327

(51) Int. Cl.
*H03K 3/03* (2006.01)

(52) U.S. Cl.
CPC ................................ *H03K 3/0315* (2013.01)

(58) Field of Classification Search
CPC ........ H03K 3/0315; H03K 3/011; H03B 5/32; H03B 5/1228
See application file for complete search history.

(56) References Cited

U.S. PATENT DOCUMENTS

| | | | | |
|---|---|---|---|---|
| 5,434,534 A * | 7/1995 | Lucas | H03K 17/145 327/543 |
| 9,300,247 B2 * | 3/2016 | Roine | H03B 5/24 |
| 11,018,654 B1 * | 5/2021 | Luo | G01K 7/00 |
| 2015/0097630 A1 * | 4/2015 | Gailhard | H03L 1/026 331/66 |
| 2019/0131928 A1 * | 5/2019 | Rachala | H03K 3/0315 |
| 2019/0334509 A1 * | 10/2019 | Gupta | H03K 3/011 |

FOREIGN PATENT DOCUMENTS

JP 2001068976 A 3/2001

* cited by examiner

*Primary Examiner* — Jeffrey M Shin
(74) *Attorney, Agent, or Firm* — SCULLY, SCOTT, MURPHY & PRESSER, P.C.

(57) ABSTRACT

A low-power oscillator maintains its oscillation frequency regardless of environmental conditions. The oscillator includes a reference current source, a voltage source and a ring oscillator. The reference current source outputs a reference current depending on a first power supply voltage, and the voltage source outputs a second power supply voltage depending on the reference current. The oscillation frequency of the ring oscillator depends on the second power supply voltage.

10 Claims, 7 Drawing Sheets

OSCILLATOR

CROSS-REFERENCE TO RELATED APPLICATION

This application claims priority under 35 U.S.C. § 119 to Japanese Patent Application No. 2024-135327 filed on Aug. 14, 2024. The disclosure of Japanese Patent Application No. 2024-135327, including the specification, drawings and abstract is incorporated herein by reference in its entirety.

BACKGROUND

This disclosure relates to oscillators, specifically those used under conditions where the surrounding environment changes.

Oscillators are widely used to supply operation clocks to circuits. These oscillators are required to output signals with a constant oscillation frequency, unaffected by the operating environment.

There are disclosed techniques listed below.

[Patent Document 1] Japanese Unexamined Patent Application Publication No. 2001-68976

In Patent Document 1, an oscillator that outputs a signal with a constant oscillation frequency regardless of temperature is proposed. In this oscillator, while the oscillation frequency of the ring oscillator has a negative temperature characteristic, the power supply voltage supplied to the ring oscillator is given a positive temperature characteristic, thereby maintaining a constant oscillation frequency for the ring oscillator.

Additionally, the oscillator in Patent Document 1 can reduce the variation in oscillation frequency due to variations of the threshold voltage of the transistors caused by manufacturing variations. In an oscillator, if the threshold voltage of a MOS (Metal Oxide Semiconductor) transistor varies due to manufacturing errors, the oscillation frequency decreases when the threshold voltage is high and increases when the threshold voltage is low. Patent Document 1 proposes a method to offset the variation in oscillation frequency by generating the power supply voltage using MOS transistors with similar threshold voltage variations as the ring oscillator.

SUMMARY

As will be described later, it is known that MOS transistors exhibit an operating state where the drain-source current has a positive temperature characteristic and an operating state where the drain-source current has a negative temperature characteristic, depending on the gate-source voltage.

When an oscillator is configured using a ring oscillator composed of MOS transistors, the oscillation frequency exhibits a negative temperature characteristic in the operating state where the drain-source current has a negative temperature characteristic. In this case, the configuration of the oscillator proposed in Patent Document 1 can maintain a constant oscillation frequency.

However, in recent years, there has been a demand for reduced power consumption in oscillators as well. When the power supply voltage supplied to the oscillator is lowered to reduce power consumption, the gate-source voltage of the MOS transistor decreases, resulting in a smaller drain-source current. In this case, the drain-source current of the MOS transistor will have a positive temperature characteristic, and as a result, the oscillation frequency of the ring oscillator will exhibit a positive temperature characteristic.

Therefore, the oscillator in Patent Document 1 may not maintain a constant oscillation frequency while achieving low power consumption.

Other issues and novel features will become apparent from the description of this specification and the accompanying drawings.

According to one embodiment, the oscillator includes a current source configured to output a reference current depending on a first power supply voltage from a power supply, a voltage source configured to output a second power supply voltage depending on the reference current, and a ring oscillator having a plurality of inverters and configured to output an output signal having oscillation frequency based on the second power supply voltage, each of the inverters including the first conductivity type transistor and the second conductivity type transistor complementally connected each other. The current source includes a first transistor having the first conductivity type, a fourth transistor having the second conductivity type, a fifth transistor having the first conductivity type and the sixth transistor having the second conductivity type. The first, the fourth, the fifth and the sixth transistor are coupled in series between the power supply and ground in this order. The current source further includes a second transistor having the first conductivity type, a seventh transistor having the second conductivity type and a resistor. The second and the seventh transistor and the resistor are coupled in series between the power supply and the ground in this order. The current source further a third transistor having the first conductivity type coupled between the power supply, the voltage source and the ring oscillator and configured to output the reference current to the voltage source and the ring oscillator. The first, the second and the third transistor constitute a first current mirror copying a current flowing through the second transistor. The fourth and the seventh transistor constitute a second current mirror copying a current flowing through the fourth transistor. A control terminal of the fifth transistor and a control terminal of the sixth terminal are coupled to a node between the fifth and the sixth transistor. The voltage source includes an eighth transistor having the first conductivity type and a ninth transistor having the second conductivity type. The eighth and the ninth transistor are coupled in series between the power supply and the ground. A terminal of the eighth transistor and a terminal of the ninth transistor are coupled to a node between the eighth and the ninth transistor.

According to one embodiment, a low-power oscillator capable of maintaining the oscillation frequency regardless of environmental conditions can be provided.

DETAILED DESCRIPTION

Figure 1:
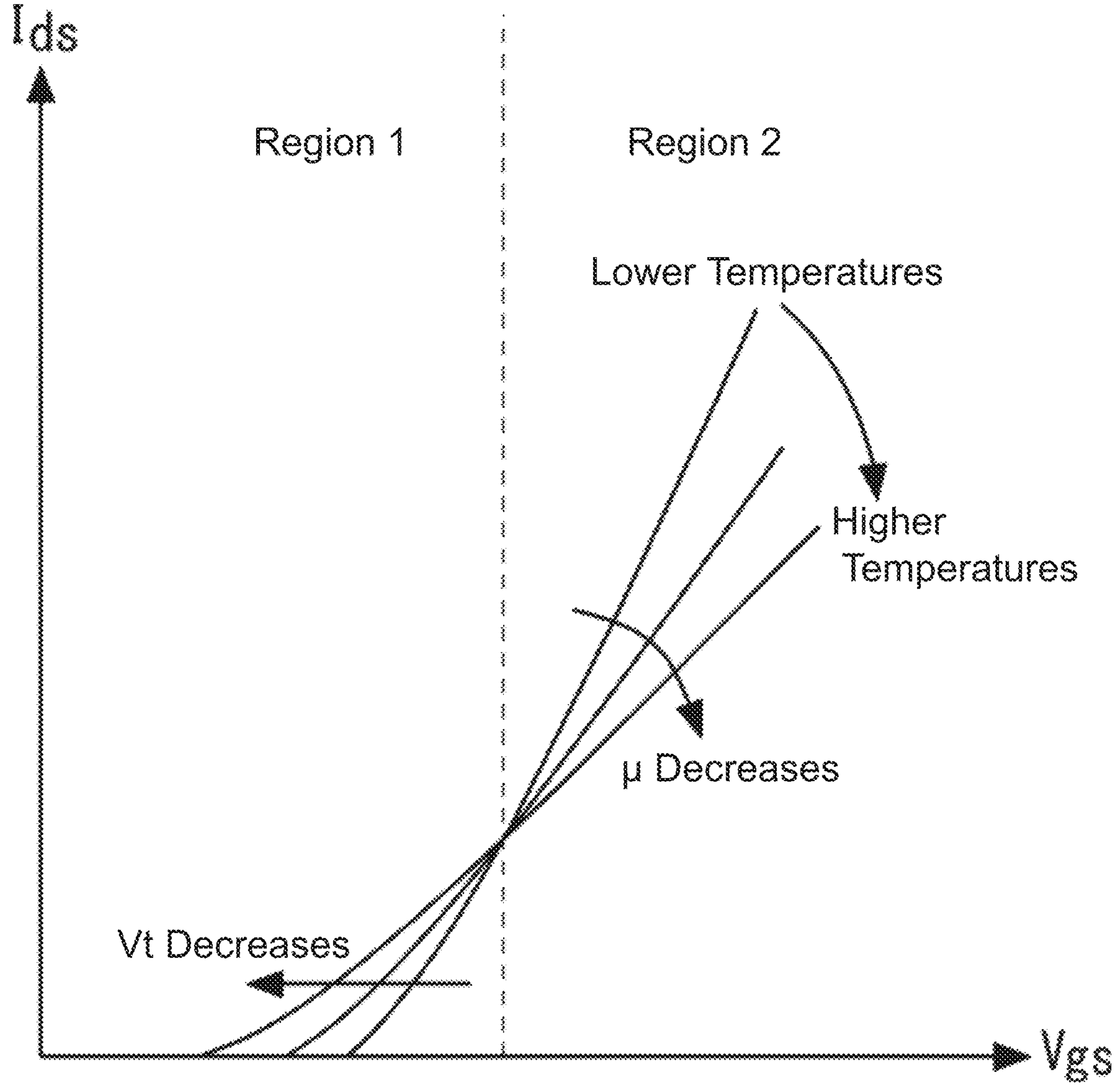
FIG. 1 is a graph showing the relationship between the drain-source current and the gate-source voltage of a MOS transistor.

The embodiments of the present invention will be described below with reference to the drawings. In each drawing, the same elements are denoted by the same reference numerals, and repetitive descriptions are omitted as necessary.

First embodiment. As a premise for understanding the oscillator according to the first embodiment, the relationship between the MOS (Metal Oxide Semiconductor) transistors constituting the oscillator and the oscillation frequency will be described.

The relationship between the drain-source current Ids and the gate-source voltage Vgs of a MOS transistor is generally expressed by the following equation using the threshold voltage Vt and the gain coefficient β of the MOS transistor.

[Equation 1]

$$I_{ds} = 0.5\beta \cdot (V_{gs} - V_t)^2 \quad [1]$$

The gain coefficient β is expressed by the following equation using the mobility μ, gate oxide film capacitance Cox, channel width W, and channel length L of the MOS transistor.

[Equation 2]

$$\beta = \mu C_{OX} \frac{W}{L} \quad [2]$$

Based on the above equation, the relationship between the drain-source current Ids and the gate-source voltage Vgs will be described. FIG. 1 is a graph showing the relationship between the drain-source current Ids and the gate-source voltage Vgs of a MOS transistor. Since both the gain coefficient β and the threshold voltage Vt of the MOS transistor have negative temperature characteristics, the relationship between the drain-source current Ids and the gate-source voltage Vgs changes with temperature. Specifically, as the temperature rises, the β in equation [1] decreases, so the rate of change of the drain-source current Ids decreases. Therefore, in FIG. 1, the slope of the curve indicating the drain-source current Ids become smaller as the temperature rises. Also, as the temperature rises, the Vt in equation [1] decreases, so the curve indicating the drain-source current Ids shifts to the left. Therefore, as shown in FIG. 1, the relationship between the drain-source current Ids and the gate-source voltage Vgs is divided into region 1, where the drain-source current Ids becomes larger at higher temperatures than at lower temperatures, and region 2, where the drain-source current Ids becomes larger at lower temperatures than at higher temperatures.

Figure 2:
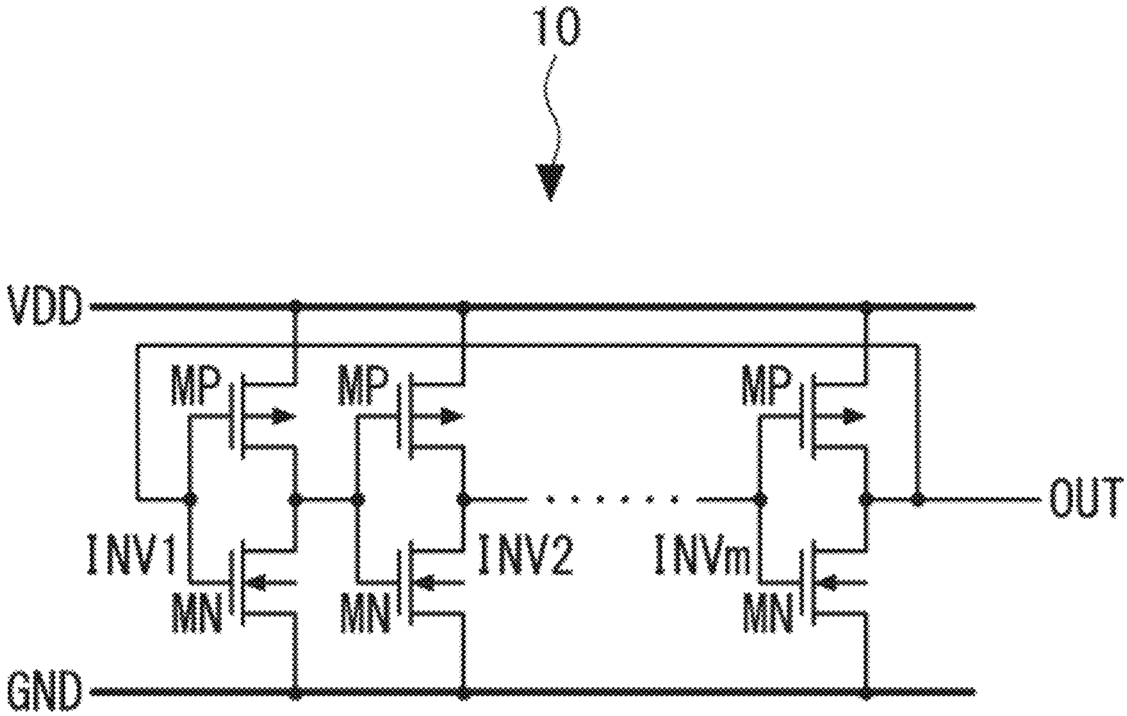
FIG. 2 is a circuit diagram showing the configuration of a general ring oscillator.

Next, a general ring oscillator will be described. FIG. 2 is a circuit diagram showing the configuration of a general ring oscillator 10. The ring oscillator 10 is configured by coupling CMOS (Complementary Metal-Oxide-Semiconductor) inverters INV1 to INVm, in which p-type transistor MP and n-type transistor MN are coupled in series, in parallel between the power supply VDD and ground. Here, m is an integer of 2 or more. Hereinafter, the p-type transistor MP is also referred to as the tenth transistor, and the n-type transistor MN is also referred to as the eleventh transistor. Also, hereinafter, the power supply voltage output by the power supply VDD is denoted as the power supply voltage VDD.

The input of the CMOS inverter INV1 and the output of the CMOS inverter INVm are coupled to the output terminal OUT. The outputs of the CMOS inverters INV1 to INVm−1 are coupled to the inputs of the CMOS inverters INV2 to INVm, respectively. In other words, if k is an integer of 1 or more and m−1 or less, the output of the CMOS inverter INVk is coupled to the input of the adjacent CMOS inverter INVk+1.

The oscillation frequency fOSC of the ring oscillator 10 is expressed by the following equation, where td is the rise and fall delay time of the output voltage per inverter stage.

[Equation 3]

$$f_{OSC} = \frac{1}{2 \cdot t_d \cdot m} \quad [3]$$

Generally, it is known that the delay time td per inverter stage becomes smaller as the drain-source current Ids of the MOS transistor increases. Therefore, due to the temperature characteristics of the MOS transistor, the oscillation frequency fOSC determined by the delay time td also exhibits temperature characteristics.

Figure 3:
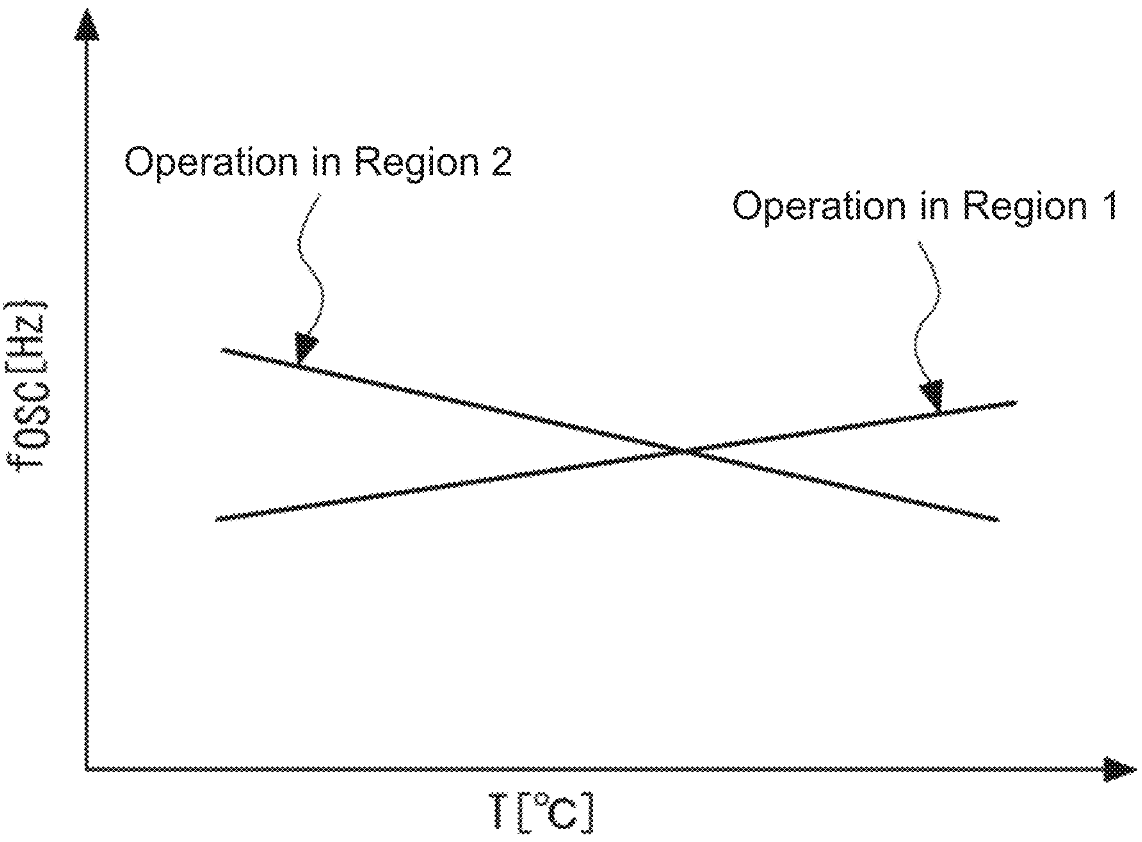
FIG. 3 is a graph schematically showing the relationship between the temperature characteristics of a MOS transistor and the temperature characteristics of the oscillation frequency of a ring oscillator.

FIG. 3 is a graph schematically showing the relationship between the temperature characteristics of a MOS transistor and the temperature characteristics of the oscillation frequency fOSC of the ring oscillator 10. When the transistors of the ring oscillator 10 are operated in region 1 of FIG. 1, the drain-source current Ids increase as the ambient temperature rises, resulting in a higher oscillation frequency fOSC according to equation [3]. In this case, the oscillation frequency fOSC exhibits a positive temperature characteristic.

On the other hand, when the transistors constituting the ring oscillator 10 are operated in region 2 of FIG. 1, the drain-source current Ids decrease as the ambient temperature rises, resulting in a lower oscillation frequency fOSC according to equation [3]. In this case, the oscillation frequency fOSC exhibits a negative temperature characteristic.

The aforementioned Patent Document 1 only considers the case where the oscillation frequency of the ring oscillator has a negative temperature characteristic in region 2 and does not accommodate the case where the oscillation frequency of the ring oscillator has a positive temperature characteristic in region 1. In other words, Patent Document 1 can only address the operation of MOS transistors in region 2.

In light of recent demands for lower power consumption, there is a need to reduce the power consumption POSC of the ring oscillator as well. This may be effectively achieved by reducing the supply voltage VDD to the ring oscillator and the consumption current IOSC of the ring oscillator. The power consumption POSC of the ring oscillator is expressed by the following equation.

[Equation 4]

$$P_{OSC} = I_{OSO} \cdot VDD \quad [4]$$

The consumption current IOSC of the ring oscillator is represented as the sum of the gate charge/discharge current Icharge and the flow-through current Ipene of the MOS transistors.

[Equation 5]

$$I_{OSC} = I_{charge} + I_{pene} \quad [5]$$

The gate charge/discharge current Icharge is expressed by the following equation, where C is the total gate capacitance of the MOS transistors constituting the ring oscillator 10.

[Equation 6]

$$I_{charge} = f_{OSC} \cdot C \cdot VDD \quad [6]$$

The flow-through current Ipene is expressed by the following equation.

[Equation 7]

$$I_{pene} \propto f_{OSC} \cdot (VDD - V_t)^2 \quad [7]$$

From the above, to reduce the power consumption POSC of the ring oscillator 10, it is effective to lower the supply voltage VDD. However, lowering the supply voltage VDD results in a decrease in the drain-source current Ids of the MOS transistors, leading to the operation of the MOS transistors in region 1 of FIG. 1. In this case, as mentioned above, the method of Patent Document 1 may not be applied, and it is not possible to suppress fluctuations in the oscillation frequency due to temperature changes.

Therefore, in the present embodiment, an oscillator is described that maintain the oscillation frequency while reducing the consumption current by lowering the supply voltage to the ring oscillator.

Hereinafter, when referring to a transistor, it is assumed to mean a MOS transistor. The term "Tr" is also used as an abbreviation for a transistor. Additionally, one of the conductivity types of the MOS transistor, p-type or n-type, is referred to as the first conductivity type, and the other as the second conductivity type. One of the sources and drains of the MOS transistor is referred to as one end, and the other as the other end, with the gate also referred to as the control terminal.

The oscillator according to the present embodiment is configured that the MOS transistors constituting the ring oscillator operate in region 1 of FIG. 1 by lowering the supply voltage to the ring oscillator. As described above, in region 1 of FIG. 1, the drain-source current Ids of the MOS transistors in the ring oscillator increase as the temperature rises. As a result, the delay time td per inverter stage decreases, leading to an increase in the oscillation frequency fOSC.

Therefore, to maintain the oscillation frequency fOSC regardless of temperature, it is sufficient to suppress the increase in the drain-source current Ids of the MOS transistors in the ring oscillator due to temperature rise. To achieve this, it is necessary to provide a negative temperature characteristic to the supply voltage to the ring oscillator. Accordingly, the oscillator, according to the present embodiment, is configured to provide a negative temperature characteristic to the supply voltage to the ring oscillator.

Figure 4:
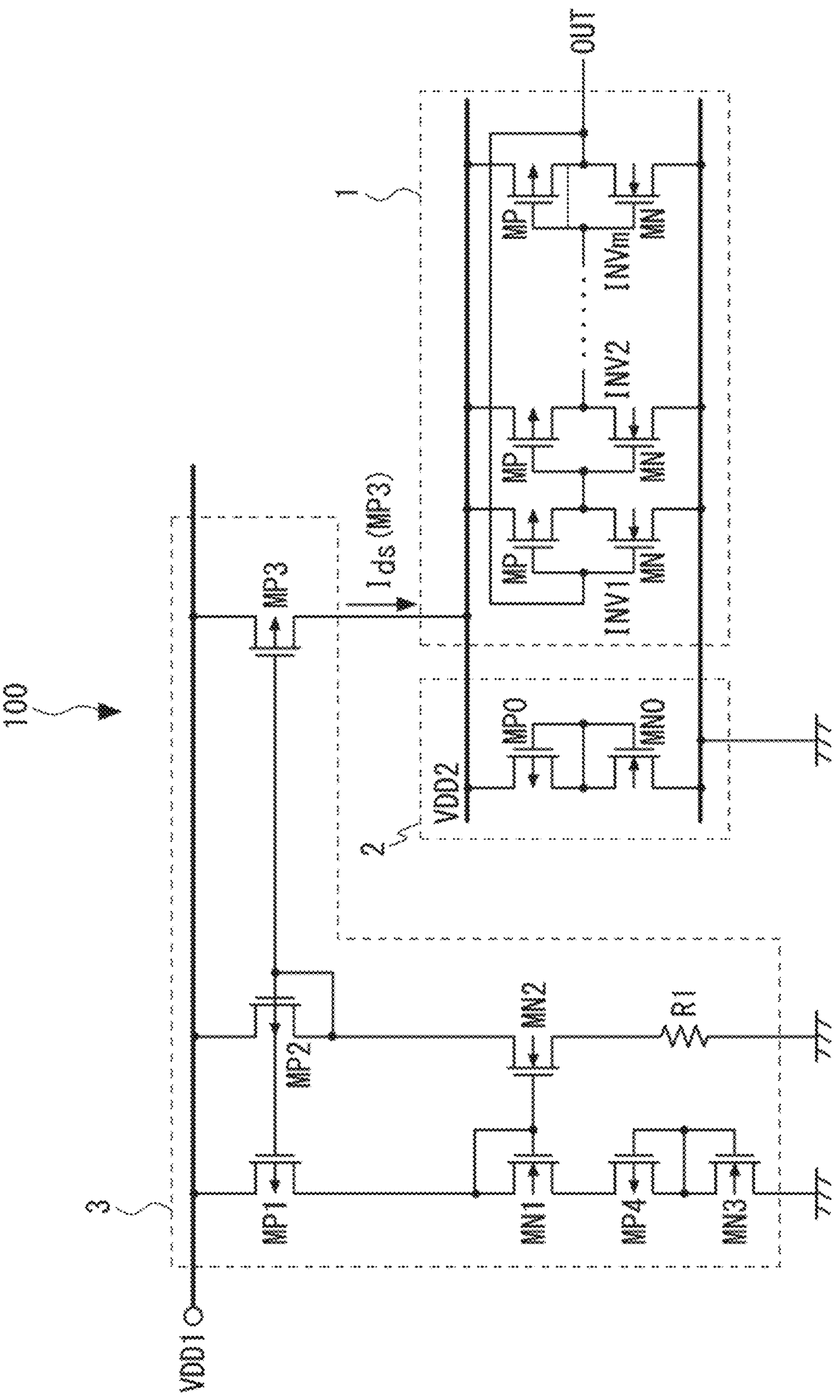
FIG. 4 is a circuit diagram showing the configuration of an oscillator according to the first embodiment.

FIG. 4 is a circuit diagram showing the configuration of the oscillator 100 according to the first embodiment. The oscillator 100 according to the first embodiment includes a ring oscillator 1, a voltage source 2, and a reference current source 3.

The ring oscillator 1 has the same configuration as the ring oscillator 10 in FIG. 2. Therefore, redundant explanations are omitted. Hereinafter, the output voltage of the voltage source 2 supplied to the ring oscillator 1 is denoted as the supply voltage VDD2.

The voltage source 2 outputs the supply voltage VDD2 according to the reference current Ids (MP3) output from the reference current source 3. The voltage source 2 is configured by coupling a p-type transistor MP0 and an n-type transistor MN0 in series. The source of the p-type transistor MP0 is coupled to the reference current source 3 and the high potential side end of the ring oscillator 1, i.e., the sources of the p-type transistors MP in the inverters from INV1 to INVm. The drain of the p-type transistor MP0 is connected to the drain of the n-type transistor MN0. The source of the n-type transistor MN0 is coupled to the ground and the low potential side end of the ring oscillator 1, i.e., the sources of the n-type transistors MN in the inverters from INV1 to INVm. The gate of the p-type transistor MP0 and the gate of the n-type transistor MN0 are coupled to the node between the drain of the p-type transistor MP0 and the drain of the n-type transistor MN0. Hereinafter, the n-type transistor MN0 is also referred to as the eighth transistor, and the p-type transistor MP0 as the ninth transistor.

The reference current source 3 outputs the reference current Ids (MP3) depending on the supply voltage output by the power supply VDD1. The reference current source 3 includes p-type transistors MP1 to MP4, n-type transistors MN1 to MN3, and a resistor R1. Hereinafter, the supply voltage output by the power supply VDD1 is denoted as the supply voltage VDD1.

Hereinafter, the p-type transistors MP1 to MP3 are also referred to as the first to third transistors, respectively. The n-type transistor MN1 is also referred to as the fourth transistor. The p-type transistor MP4 is also referred to as the fifth transistor. The n-type transistor MN3 is also referred to as the sixth transistor. The n-type transistor MN2 is also referred to as the seventh transistor.

The p-type transistor MP1, n-type transistor MN1, p-type transistor MP4, and n-type transistor MN3 are coupled in series in this order between the power supply VDD1 and the ground. That is, the source of the p-type transistor MP1 is coupled to the power supply VDD1. The drain of the p-type transistor MP1 is coupled to the drain of the n-type transistor MN1. The source of the n-type transistor MN1 is coupled to the source of the p-type transistor MP4. The drain of the p-type transistor MP4 is coupled to the drain of the n-type transistor MN3. The source of the n-type transistor MN3 is coupled to the ground. The gate of the p-type transistor MP4 and the gate of the n-type transistor MN3 are coupled to the node between the drain of the p-type transistor MP4 and the drain of the n-type transistor MN3.

The p-type transistor MP2, n-type transistor MN2, and resistor R1 are coupled in series in this order between the power supply VDD1 and the ground. That is, the source of the p-type transistor MP2 is coupled to the power supply VDD1. The drain of the p-type transistor MP2 is coupled to the drain of the n-type transistor MN2. A resistor R1 is inserted between the source of the n-type transistor MN2 and the ground.

The p-type transistor MP3 is coupled between the power supply VDD1 and the high potential side end of the ring oscillator 1 and the voltage source 2, i.e., the node of the supply voltage VDD2. In other words, the source of the p-type transistor MP3 is coupled to the power supply VDD1, and the drain is coupled to the high potential side end of the ring oscillator 1 and the voltage source 2. The p-type transistor MP3 outputs the drain-source current Ids (MP3) as a reference current.

The gates of the p-type transistors MP1 to MP3 are coupled to each other, and the gate and drain of the p-type transistor MP2 are coupled. Therefore, the p-type transistors MP1 to MP3 constitute a current mirror that copies the current flowing through the p-type transistor MP2.

The gate of the n-type transistor MN1 is coupled to the drain of the n-type transistor MN1 and the gate of the n-type transistor MN2. As a result, the n-type transistors MN1 and MN2 constitute a current mirror that copies the current flowing through the n-type transistor MN1.

Next, the operation of the oscillator 100 will be described. The supply voltage VDD2 output by the voltage source 2 is determined by the sum of the gate-source voltage Vgs (MP0) of the p-type transistor MP0 and the gate-source voltage Vgs (MN0) of the n-type transistor MN0.

[Equation 8]

$$VDD2 = V_{gs}(MP0) + V_{gs}(MN0) = \left(\frac{2 \cdot I_{ds}(MP0)}{\beta(MP0)}\right)^{0.5} + V_t(MP0) + \left(\frac{2 \cdot I_{ds}(MN0)}{\beta(MN0)}\right)^{0.5} + V_t(MN0) \quad [8]$$

In the above equation, Ids (MP0) is the drain-source current of the p-type transistor MP0. Ids (MN0) is the drain-source current of the n-type transistor MN0. B (MP0) is the gain coefficient of the p-type transistor MP0. B (MN0) is the gain coefficient of the n-type transistor MN0. Vt (MP0) is the threshold voltage of the p-type transistor MP0. Vt (MN0) is the threshold voltage of the n-type transistor MN0.

Since the same current flows through the p-type transistor MP0 and the n-type transistor MN0, the following equation holds

[Equation 9]

$$I_{ds}(MP0) = I_{ds}(MN0) = I_{ds}(MP3) \rightarrow Iosc \quad [9]$$

Next, the drain-source current of the p-type transistor MP3, i.e., the reference current Ids (MP3), will be described. When the W/L of the p-type transistors MP1 and MP2 constituting the current mirror are the same, the gate-source voltage Vgs (MP1) of the p-type transistor MP1 and the gate-source voltage Vgs (MP2) of the p-type transistor MP2 become equal.

[Equation 10]

$$V_{gs}(MP1) = V_{gs}(MP2) \quad [10]$$

Therefore, the drain-source current Ids (MP1) of the p-type transistor MP1 and the drain-source current Ids (MP2) of the p-type transistor MP2 also become equal.

[Equation 11]

$$I_{ds}(MP1) = I_{ds}(MP2) \quad [11]$$

Additionally, when the W/L ratios of the n-type transistors MN1 and MN2, which constitute the current mirror, are the same, the gate-source voltage Vgs (MN1) of the n-type transistor MN1 and the gate-source voltage Vgs (MN2) of the n-type transistor MN2 become equal.

[Equation 12]

$$V_{gs}(MN1) = V_{gs}(MN2) \quad [12]$$

Therefore, the sum of the gate-source voltage Vgs (MP4) of the p-type transistor MP4 and the gate-source voltage Vgs (MN3) of the n-type transistor MN3 is equal to the product of the drain-source voltage Ids (MP2) of the p-type transistor MP2, which indicates the potential difference across the resistor R1, and the resistor R1, as shown in the following equation.

[Equation 13]

$$I_{ds}(MP2) = \frac{V_{gs}(MP4) + V_{gs}(MN3)}{R1} \quad [13]$$

In this configuration, the resistance value of resistor R1 is set such that the gate-source voltage Vgs (MP4) of the p-type transistor MP4 and the gate-source voltage Vgs (MN3) of the n-type transistor MN3 operate within region 1, under the condition where the power supply voltage VDD1, set to reduce power consumption, is supplied. Additionally, resistor R1 is designed to have a positive temperature characteristic. This can be achieved, for example, by constructing resistor R1 using a diffusion resistor or a polysilicon resistor. Hereinafter, T is assumed to indicate temperature.

[Equation 14]

$$\Delta R1 \geq \Delta T \quad [14]$$

Therefore, the following holds true.

[Equation 15]

$$\frac{\Delta[V_{gs}(MP4) + V_{gs}(MN3)]}{\Delta T} < 0 \quad [15]$$

[Equation 16]

$$\frac{\Delta I_{ds}(MP2)}{\Delta T} < 0 \quad [16]$$

Moreover, since the p-type transistors MP2 and MP3 form a current mirror, the following equation holds true. In the following equation, WMP2 and WMP3 are the channel widths of the p-type transistors MP2 and MP3, respectively. LMP2 and LMP3 are the channel lengths of the p-type transistors MP2 and MP3, respectively.

[Equation 17]

$$I_{ds}(MP3) = \frac{W_{MP3}/L_{MP3}}{W_{MP2}/L_{MP2}} \cdot I_{ds}(MP2) \quad [17]$$

Therefore, from equation [16], the following holds true.

[Equation 18]

$$\frac{\Delta I_{ds}(MP3)}{\Delta T} < 0 \quad [18]$$

Thus, in this case, the reference current Ids (MP3) output by the reference current source 3 has a negative temperature characteristic.

When the temperature rises while the power supply voltage VDD2 is constant, the drain-source voltage of each transistor operating in region 1 of FIG. 1 increases. However, since the reference current Ids (MP3) output by reference current source 3 has a negative temperature characteristic, the power supply voltage VDD2 output by the voltage source 2 decreases as the temperature rises. As a result, the increase in the drain-source voltage of the transistors is offset by the decrease in the power supply voltage VDD2, maintaining the drain-source voltage of the transistors constant. Consequently, the oscillation frequency fOSC of the ring oscillator 1 is maintained constantly regardless of temperature.

As described above, according to this configuration, it is possible to realize an oscillator that maintain the oscillation frequency of the output signal constant regardless of temperature while operating the MOS transistors in region 1 with reduced power supply voltage for low power consumption operation.

Second Embodiment

As a premise for understanding the oscillator according to the second embodiment, first, consider the behavior when the power supply VDD1 is activated in the oscillator 100. When the power supply VDD1 is activated in oscillator 100, due to the gate-source capacitance of the p-type transistor MP2 of the reference current source 3, the gate potential of the p-type transistor MP2 starts from VDD1. Therefore, until the gate-source capacitance of the p-type transistor MP2 is charged by leakage current or the like, the p-type transistor MP2 remains off. Generally, if the temperature is 25 degrees Celsius, the p-type transistor MP2 remains off for about 10 msec to 100 sec from the activation of the power supply VDD1.

While the p-type transistor MP2 is off, the reference current source 3 does not operate, so no reference current is output from the p-type transistor MP3 to the ring oscillator 1. Therefore, the ring oscillator 1 does not start.

In other words, even if the power supply VDD1 is activated, the startup of the oscillator 100 is delayed for about 10 msec to 100 sec until the p-type transistor MP2 in the reference current source 3 transitions from the off state to the on state.

Therefore, in this embodiment, an oscillator that starts operation promptly after power-on is described.

Figure 5:
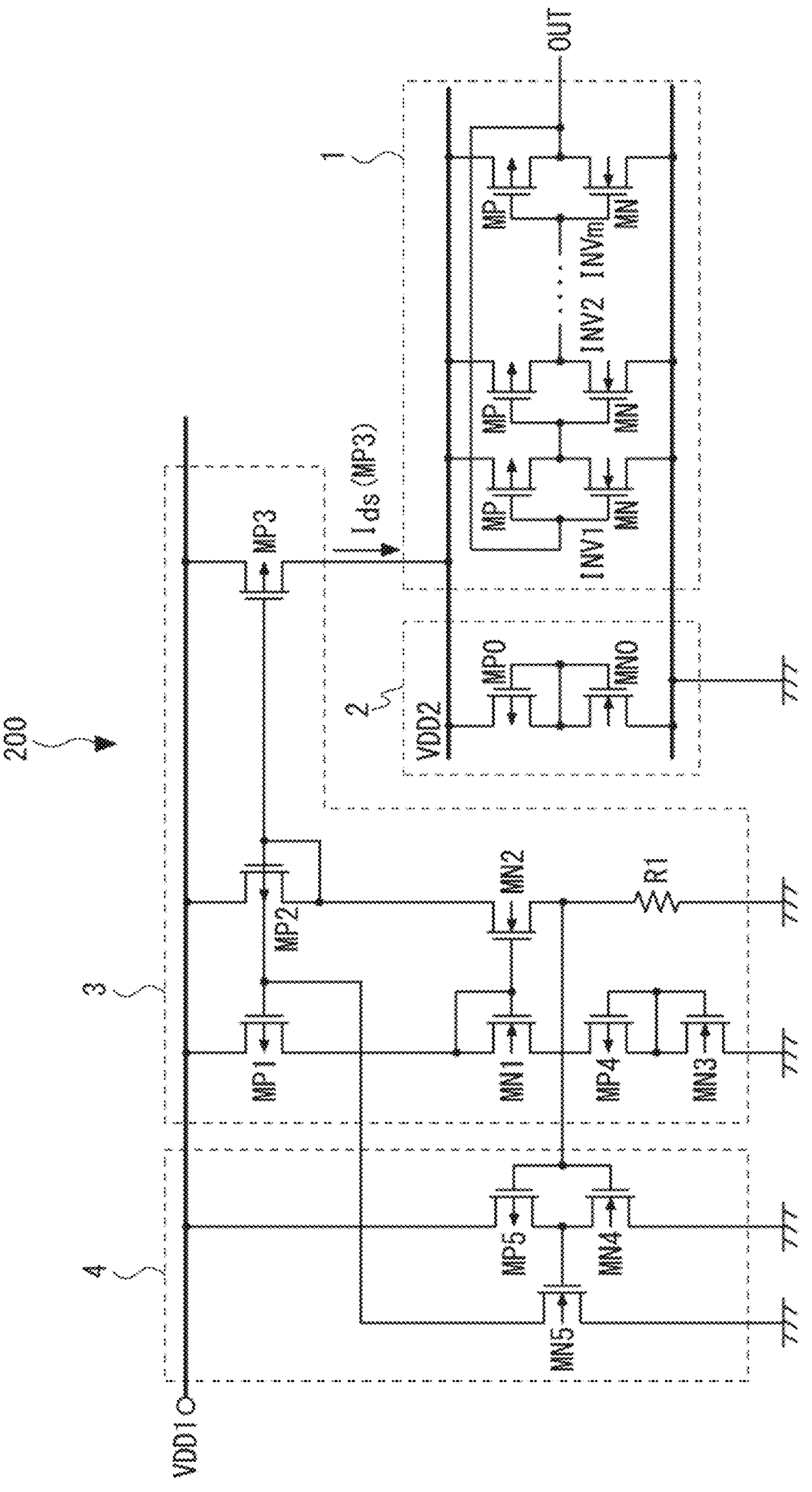
FIG. 5 is a circuit diagram showing the configuration of an oscillator according to the second embodiment.

FIG. 5 is a circuit diagram showing the configuration of the oscillator 200 according to the second embodiment. The oscillator 200 has a configuration in which a startup circuit 4 is further provided to the oscillator 100 according to the first embodiment. The startup circuit 4 includes a p-type transistor MP5 and n-type transistors MN4 and MN5. Hereinafter, the p-type transistor MP5 is also referred to as the twelfth transistor. The n-type transistors MN4 and MN5 are also referred to as the thirteenth and fourteenth transistors, respectively.

The p-type transistor MP5 and the n-type transistor MN4 are coupled in series between the power supply VDD1 and the ground in this order. That is, the source of the p-type transistor MP5 is coupled to the power supply VDD1. The drain of the p-type transistor MP5 is coupled to the drain of the n-type transistor MN4. The source of the n-type transistor MN4 is coupled to the ground. The gates of the p-type transistor MP5 and the n-type transistor MN4 are coupled to the node between the drain of the n-type transistor MN2 and the resistor R1.

The drain of the n-type transistor MN5 is coupled to the gates of the p-type transistors MP1 to MP3, and the source is coupled to the ground. The gate of the n-type transistor MN5 is coupled to the node between the drain of the p-type transistor MP5 and the drain of the n-type transistor MN4.

Next, the operation of the oscillator 200 will be described. In oscillator 200, before the activation of the power supply VDD1, the gate potential of the p-type transistor MP5 of the startup circuit 4 is pulled down to the ground potential by the resistor R1 of the reference current source 3. When the power supply VDD1 is activated in this state, the p-type transistor MP5 turns on immediately.

Therefore, the gate potential of the n-type transistor MN5 becomes the power supply voltage VDD1, and the n-type transistor MN5 turns on. As a result, the gate potential of the p-type transistor MP2 is pulled down to ground potential. Consequently, the p-type transistor MP2 turns on, the reference current source 3 is activated, and the reference current Ids (MP3) is supplied from the p-type transistor MP3 to the ring oscillator 1.

In this case, usually, regardless of temperature, the current supply from the p-type transistor MP3 to the ring oscillator 1 starts about 10 μsec after the activation of the power supply VDD1. Therefore, by providing startup circuit 4, the oscillator 200 can start up more quickly compared to the oscillator 100.

After the activation of the reference current source 3, the node between the n-type transistor MN2 and the resistor R1 rises from the ground potential, and the n-type transistor MN4 turns on. As a result, the potential of the node between the p-type transistor MP5 and the n-type transistor MN4 decreases, and the n-type transistor MN5 turns off. This automatically stops the operation of pulling down the gate of the p-type transistor MP2 to the ground potential by the startup circuit 4. Therefore, the startup circuit 4 automatically stops operating without affecting the operation of the oscillator 200.

As described above, according to oscillator 200, it can be understood that the reference current source 3 can be quickly activated after the power supply VDD1 is activated by providing startup circuit 4.

Third Embodiment

In the oscillator according to the above-described embodiment, if noise is superimposed on the power supply voltage VDD1, noise may be input to the ring oscillator 1, and jitter may be superimposed on the output signal OUT used as a clock signal.

For example, consider the case where the oscillator according to the above-described embodiment is mounted on an IC (Integrated Circuit) installed in an automobile. Regarding noise resistance for ICs for automotive applications, for example, in the IEC standards, which are attracting attention in the automotive industry, the IEC 62132-4 (DPI method: Direct Power Injection method) is standardized as an EMC (Electromagnetic Compatibility) immunity test. In the DPI method, even if noise of 3.3V±600 mV (50Ω equivalent) is superimposed on the power supply terminal in the range of usually 150 KHz to 1 GHz on the local pin (a pin not connected outside the ECU (Electronic Control Unit) but coupled to components including other ICs within the ECU), it is required that the IC does not malfunction.

When noise is superimposed on the power supply voltage, noise may be superimposed on the output clock of the oscillator mounted on the IC, so an oscillator with excellent noise resistance is required. Therefore, in this embodiment, an oscillator that can suppress the influence of noise superimposed on the power supply voltage VDD1 is described.

Figure 6:
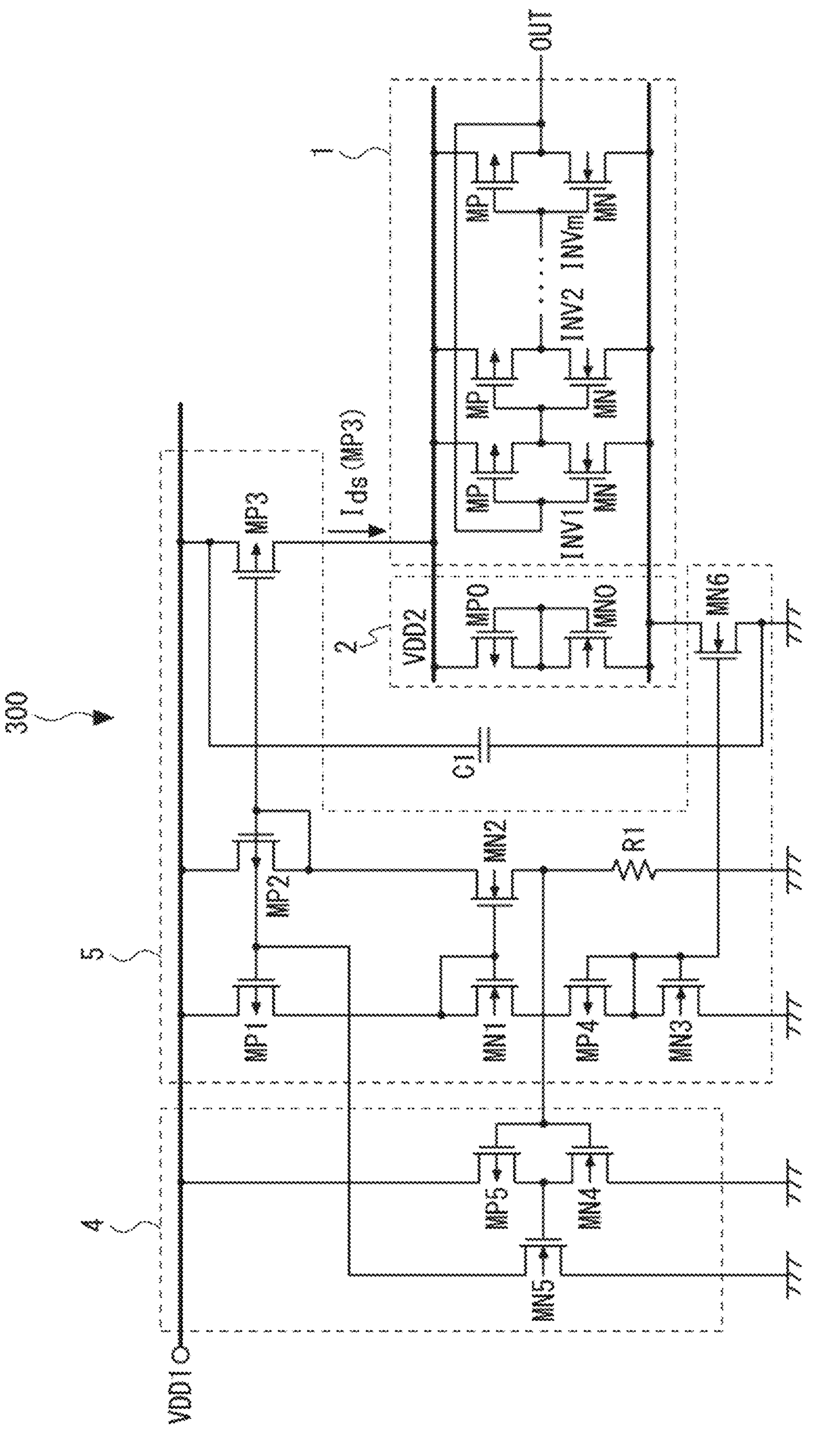
FIG. 6 is a circuit diagram showing the configuration of an oscillator according to the third embodiment.

FIG. 6 is a circuit diagram showing the configuration of the oscillator 300 according to the third embodiment. The oscillator 300 has a configuration in which the reference current source 3 of the oscillator 200 according to the second embodiment is replaced with reference current source 5, and a capacitor C1 is further provided.

The reference current source 5 has a configuration in which an n-type transistor MN6 is added to the reference current source 3. The n-type transistor MN6 is also referred to as the fifteenth transistor. The n-type transistor MN6 is inserted between the ring oscillator 1 and the ground. That is, the drain of the n-type transistor MN6 is connected to the source of the inverter INV1 to INVm of the ring oscillator 1, and the source of the n-type transistor MN6 is connected to the ground. The gate of the n-type transistor MN6 is connected to the gate and drain of the p-type transistor MP4 and the n-type transistor MN3.

The capacitor C1 is inserted between the source of the p-type transistor MP3 of the reference current source 3 and the source of the n-type transistor MN6.

Figure 7:
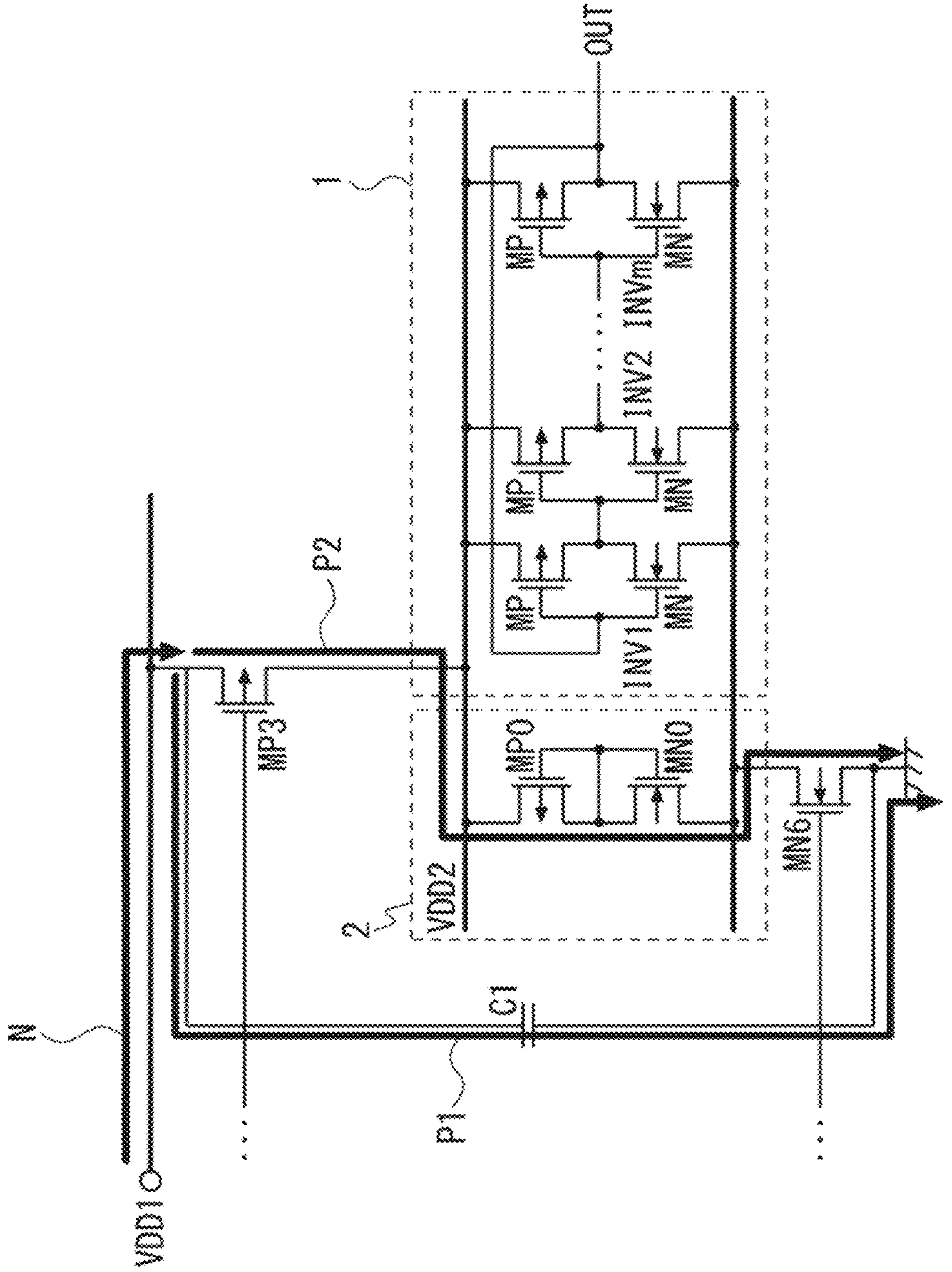
FIG. 7 is a diagram showing the propagation of noise in the oscillator according to the third embodiment.

Next, the operation of the oscillator 300 when noise is superimposed on the power supply voltage VDD1 will be described. FIG. 7 is a diagram showing the propagation of noise in the oscillator 300 according to the third embodiment. When noise N is superimposed on the power supply voltage VDD1, the noise N propagates to the source of the p-type transistor MP3. Subsequently, the noise Nis branched into a first path P1, which propagates to the ground via the capacitor C1, and a second path P2, which propagates to the ground via the p-type transistor MP3, p-type transistor MP, n-type transistor MN, and n-type transistor MN6.

At this time, the impedance Z1 of the first path P1 is expressed by the following equation.

[Equation 19]

$$Z1 = \frac{1}{2\pi f C1} \quad [19]$$

In the above equation, f is the frequency of the noise.

Also, the impedance Z2 of the second path P2 is expressed by the following equation.

[Equation 20]

$$Z2 = r_{out}(MP3) + \frac{1}{gm(MP0)} + \frac{1}{gm(MN0)} + r_{out}(MN6) \quad [20]$$

In the above equation, route (MP3) and route (MN6) are the output resistances of the p-type transistor MP3 and the n-type transistor MN6, respectively. gm (MP0) and gm (MN0) are the transconductances of the p-type transistor MP0 and the n-type transistor MN0, respectively.

Generally, the output resistance of a MOS transistor is significantly larger than the reciprocal of the transconductance. Therefore, the contribution of the reciprocal of the transconductance in equation is negligibly small, allowing equation to be transformed into the following equation [21].

[Equation 21]

$$Z2 = r_{out}(MP3) + r_{out}(MN6) \quad [21]$$

Here, if equation and equation are equal, the following equation holds.

[Equation 22]

$$f = \frac{1}{2\pi C1(r_{out}(MP3) + r_{out}(MN6))} \quad [22]$$

In this case, the noise at the frequency f determined by equation propagates equally through the first path P1 and the second path P2.

However, by designing the capacitance value of the capacitor C1 that the impedance Z1 of the first path P1 is smaller than the impedance Z2 of the second path P2, the noise propagating through the first path P1 can be made larger, for example, ten times larger than the noise propagating through the second path P2. This allows the noise input to the voltage source 2 via the second path P2 to be effectively reduced by suitably designing the capacitance value of the capacitor C1.

Next, a specific example of noise reduction by the capacitor C1 will be described. In this example, the noise frequency f is set to 150 kHz, and the capacitance value of the capacitor C1 is set to 100 pF. At this time, from equation [19], the impedance Z1 of the first path P1 becomes 106 kΩ.

[Equation 23]

$$Z1 = \frac{1}{2\pi \cdot 15 \cdot 10^4 \cdot 10 \cdot 10^{-12}} \approx 106k\Omega \quad [23]$$

Next, the impedance Z2 of the second path P2 will be examined. The output resistance route of a MOS transistor is generally expressed by the following equation.

[Equation 24]

$$r_{out} = \frac{1}{\lambda \cdot I_{ds}} \quad [24]$$

In the above equation, λ is the channel length modulation parameter, which is approximately 0.1/L regardless of whether the MOS transistor is p-type or n-type.

If the channel length L of the p-type transistor MP0 and the n-type transistor MN0 is 5 μm, λ becomes 0.02. If the drain-source current Ids (MP0) of the p-type transistor MP0 and the drain-source current Ids (MN0) of the n-type transistor MN0 are 100 μA, the impedance Z2 of the second path P2 becomes 1000 kΩ.

[Equation 25]

$$Z2 = 2 \cdot 0.02 \cdot 100 \cdot 10^{-6} = 1000k\Omega \quad [25]$$

Therefore, it can be understood from this specific example that the noise propagating through the first path P1 can be made ten times larger than the noise propagating through the second path P2.

As described above, according to the oscillator 300, by providing the first path P1, which is a bypass path for power supply noise propagating to the ring oscillator 1 and the voltage source 2, the influence of noise on the output voltage VDD2 of the voltage source 2 can be suppressed.

Other Embodiments

As described above, the present disclosure has been explained with reference to the embodiments, but the present disclosure is not limited to the above-described embodiments. Various changes can be made to the configuration and details of the present disclosure within the scope of the present disclosure as understood by those skilled in art. Each embodiment can be combined with other embodiments as appropriate.

The oscillator 300 according to the above-described third embodiment has been described as a modified example of the oscillator 200 according to the second embodiment, but this is merely an example. The oscillator 100 according to the first embodiment may be provided with a noise bypass path by adding the capacitor C1 and the n-type transistor MN6.

Note that the operation of the oscillator according to the above-described embodiment has been described for the case where the MOS transistor operates in region 1, but even when the MOS transistor operates in region 2, the oscillation frequency of the output signal OUT can be maintained constant regardless of temperature.

Each drawing is merely illustrative for explaining one or more embodiments. Each drawing is not necessarily associated with only one specific embodiment but may be associated with one or more other embodiments. As will be understood by those skilled in the art, various features or steps described with reference to anyone drawing can be combined with features or steps shown in one or more other drawings to create embodiments not explicitly illustrated or described. Not all features or steps shown in anyone's drawing are necessarily essential, and some features or steps may be omitted. The order of steps described in any drawing may be changed as appropriate.

What is claimed is:

1. An oscillator comprising:

a current source configured to output a reference current depending on a first power supply voltage from a power supply;

a voltage source configured to output a second power supply voltage depending on the reference current, and a ring oscillator having a plurality of inverters and configured to output an output signal having oscillation frequency based on the second power supply voltage, each of the inverters including the first conductivity type transistor and the second conductivity type transistor complementally connected each other, wherein the current source comprises:

a first transistor having the first conductivity type, a fourth transistor having the second conductivity type, a fifth transistor having the first conductivity type and the sixth transistor having the second conductivity type, the first, the fourth, the fifth and the sixth transistor being coupled in series between the power supply and ground in this order;

a second transistor having the first conductivity type, a seventh transistor having the second conductivity type and a resistor, the second and the seventh transistor and the resistor being coupled in series between the power supply and the ground in this order, and a third transistor having the first conductivity type coupled between the power supply, the voltage source and the ring oscillator and configured to output the reference current to the voltage source and the ring oscillator, wherein the first, the second and the third transistor constitute a first current mirror copying a current flowing through the second transistor, wherein the fourth and the seventh transistor constitute a second current mirror copying a current flowing through the fourth transistor, wherein a control terminal of the fifth transistor and a control terminal of the sixth terminal are coupled to a node between the fifth and the sixth transistor, and wherein the voltage source includes an eighth transistor having the first conductivity type and a ninth transistor having the second conductivity type, the eighth and the ninth transistor being coupled in series between the power supply and the ground, a terminal of the eighth transistor and a terminal of the ninth transistor being coupled to a node between the eighth and the ninth transistor.

2. The oscillator according to claim 1, wherein each of the first, the second and the third transistor includes one of source and drain supplied with the first power supply voltage, and a control terminal of the first transistor, a control terminal of the second transistor and a control terminal of the third transistor are coupled to each other, wherein the second transistor includes the other of source and drain coupled to the control terminal of the second transistor and to one of source and drain of the seventh transistor, wherein the fourth transistor includes one of source and drain coupled to the other of source and drain of the first transistor and a control terminal of the fourth transistor and a control terminal of the seventh transistor, and the other of source and drain coupled to one of source and drain of the fifth transistor, wherein the fifth transistor includes the other of source and drain coupled to a control terminal of the fifth transistor and a control terminal of the sixth transistor and one of source and drain of the sixth transistor, wherein the sixth transistor includes the other of source and drain coupled to the ground, wherein the resistor includes one end coupled to the other of source and drain of the seventh transistor and the other end coupled to the ground, wherein the eight transistor includes one of source and drain coupled to the other of source and drain of the third transistor and a high potential side end of the ring oscillator, and the other of source and drain coupled to a control terminal of the eighth transistor and one of source and drain of the ninth transistor and a control terminal of the ninth transistor, and wherein the ninth transistor includes the other of source and drain coupled to the ground and a low potential side end of the ring oscillator.

3. The oscillator according to claim 1, wherein the first power supply voltage is set so that current flowing through the first to the ninth transistors and the transistor of the ring oscillator has a negative temperature characteristic, thereby the oscillation frequency of the output signal has positive temperature characteristic.

4. The oscillator according to claim 1, wherein value of the resistor has a positive temperature characteristic while the first power supply voltage is supplied.

5. The oscillator according to claim 1, wherein each of the first to the ninth transistors and the transistors of the ring oscillator comprises a MOS (Metal Oxide Semiconductor) transistor, the drain-source current of the MOS transistor has positive temperature characteristic when the gate-source voltage of the MOS transistor is lower than a predetermined voltage, wherein the first power supply voltage is set so that the gate to source voltage of each of the first to the ninth transistors and the transistors of the ring oscillator is lower than the predetermined voltage.

6. The oscillator according to claim 1, wherein each of the plurality of inverters of the ring oscillator includes a tenth transistor having the first conductivity type and a eleventh transistor having the second conductivity type, the tenth and the eleventh transistor are coupled in series between the voltage source and the ground, a source of the tenth transistor is supplied with the second power supply voltage, gate terminals of both the tenth and the eleventh transistor is coupled to each other as an inverter input, a connection node between the tenth and the eleventh transistor is an inverter output, wherein the plurality of inverters are coupled in such manner that the inverter output of a preceding one of the plurality of inverters is coupled to the inverter input of a succeeding one of the plurality of inverters and the inverter output of a last one of the plurality of inverters is coupled to a first one of the plurality of invertors as the inverter input.

7. The oscillator according to claim 1, further comprising:

a startup circuit including a twelfth transistor having the first conductivity type, a thirteenth and a fourteenth transistor having the second conductivity type, and being configured to activate the current source, wherein the twelfth transistor has one of source and drain supplied with the first power supply voltage, wherein the thirteenth transistor has one of source and drain coupled to the other of source and drain of the twelfth transistor, and the other of source and drain coupled to the ground, wherein a gate of the twelfth transistor and a gate of the thirteenth transistor are coupled to each other and to a connection node between the seventh transistor and the resistor, and wherein the fourteenth transistor is coupled between the control terminal of the first transistor and the ground and includes a gate coupled to a connection node between the twelfth and the thirteenth transistor.

8. The oscillator according to claim 7, further comprising:

a bypass path between the power supply and the ground without through the third transistor and the current source, wherein the bypass path is configured to have an impedance that is lower than an impedance of a path for a noise superimposed on the first power supply voltage to propagate through the third transistor and the voltage source to the ground.

9. The oscillator according to claim 8, wherein the bypass path includes a capacitor coupled between high potential side of the third transistor and the ground, and a fifteenth transistor having the second conductivity type and coupled between low potential side of the eleventh transistor and the ground, wherein the fifteenth transistor includes a control terminal coupled to the control terminal of the fifth transistor, and wherein a capacitor value of the capacitor is set to have an impedance lower than the ring oscillator for the noise.

10. The oscillator according to claim 1, wherein the first conductivity type is a P-type and the second conductivity type is an N-type.

* * * * *